United States Patent
Courtel et al.

(10) Patent No.: US 9,690,727 B2
(45) Date of Patent: Jun. 27, 2017

(54) SYSTEM INTERNAL LATENCY MEASUREMENTS IN REALTIME APPLICATIONS

(71) Applicant: AMTEL Corporation, San Jose, CA (US)

(72) Inventors: Karl Jean-Paul Courtel, Reze (FR); Laurentiu Birsan, Saint Herblain (FR); Stein Danielsen, Flatasen (NO); Ingar Hanssen, Trondheim (NO)

(73) Assignee: Atmel Corporation, San Jose, CA (US)

( * ) Notice: Subject to any disclaimer, the term of this patent is extended or adjusted under 35 U.S.C. 154(b) by 305 days.

(21) Appl. No.: 14/530,622

(22) Filed: Oct. 31, 2014

(65) Prior Publication Data

US 2016/0124879 A1 May 5, 2016

(51) Int. Cl.
| | |
|---|---|
| *G06F 13/32* | (2006.01) |
| *G06F 1/08* | (2006.01) |
| *G06F 11/36* | (2006.01) |
| *G06F 17/50* | (2006.01) |
| *G06F 13/38* | (2006.01) |

(Continued)

(52) U.S. Cl.
CPC ....... *G06F 13/32* (2013.01); *G01R 31/31725* (2013.01); *G01R 31/31727* (2013.01); *G06F 1/08* (2013.01); *G06F 11/3636* (2013.01); *G06F 13/385* (2013.01); *G06F 15/7814* (2013.01); *G06F 17/5031* (2013.01)

(58) Field of Classification Search
None
See application file for complete search history.

(56) References Cited

U.S. PATENT DOCUMENTS 4,423,498 A * 12/1983 Kimura .............. G01R 29/0273
327/31
4,692,710 A * 9/1987 Shvartsman ....... G01R 29/0273
327/26

(Continued)

FOREIGN PATENT DOCUMENTS

GB 2519181 A * 4/2015 ....... G01R 31/31727

OTHER PUBLICATIONS

'Pulsewidth Measurements Using an Integrated Pulse Shrinking Delay Line' by Timo Rahkonen and Juha Kostamovaara, copyright 1990, IEEE.*

(Continued)

*Primary Examiner* — Steven Snyder
(74) *Attorney, Agent, or Firm* — Fish & Richardson P.C.

(57) ABSTRACT

Systems, methods, circuits and computer-readable mediums for system internal latency measurements in realtime applications are disclosed. In some implementations, a trigger signal is selected from a plurality of trigger signals for interrupting a processor of an integrated circuit system. The trigger signal includes a pulse having width. The system detects a rising edge of the pulse and starts a counter. The system detects a falling edge of the pulse and stops the counter. The system then compares a count of the counter with first and second values stored in first and second registers, respectively. The first value represents a minimum pulse width and the second value represents a maximum pulse width. The count is stored in the first or second register based on a result of the comparing.

19 Claims, 5 Drawing Sheets

(51) Int. Cl.
*G01R 31/317* (2006.01)
*G06F 15/78* (2006.01)

(56) References Cited

U.S. PATENT DOCUMENTS

| | | | | | |
|---|---|---|---|---|---|
| 4,912,419 | A * | 3/1990 | Young | ............... | G01R 23/10 327/102 |
| 5,542,076 | A * | 7/1996 | Benson | ............... | G06F 9/4812 710/260 |
| 5,581,699 | A * | 12/1996 | Casal | ............... | G01R 31/31727 714/55 |
| 6,128,754 | A * | 10/2000 | Graeve | ............... | G01R 31/31935 714/32 |
| 6,549,359 | B1 * | 4/2003 | Bennett | ............... | G11B 19/22 360/69 |
| 6,759,941 | B2 * | 7/2004 | Kari | ............... | G06K 19/07 340/5.6 |
| 6,983,394 | B1 * | 1/2006 | Morrison | ............... | G01R 31/31708 713/500 |
| 7,284,142 | B2 * | 10/2007 | Noha | ............... | G06F 1/04 713/502 |
| 8,531,225 | B1 * | 9/2013 | Hussain | ............... | H03K 5/133 327/276 |
| 8,887,120 | B1 * | 11/2014 | Verma | ............... | G06F 17/5031 326/101 |
| 9,391,615 | B2 * | 7/2016 | Shin | ............... | H03K 19/0016 |
| 2001/0037491 | A1 * | 11/2001 | Boggs | ............... | G06F 1/025 717/128 |
| 2001/0038341 | A1 * | 11/2001 | Kari | ............... | G06K 19/07 340/13.2 |
| 2003/0154043 | A1 * | 8/2003 | Singh | ............... | G01R 29/02 702/79 |
| 2005/0257101 | A1 * | 11/2005 | Adams | ............... | G01R 31/31937 714/48 |
| 2006/0212679 | A1 * | 9/2006 | Alfano | ............... | G06F 1/08 712/38 |
| 2011/0113291 | A1 * | 5/2011 | Ike | ............... | G06F 11/3636 714/45 |
| 2011/0291584 | A1 * | 12/2011 | Filippo | ............... | G06F 7/602 315/291 |
| 2013/0297974 | A1 * | 11/2013 | Milks | ............... | G06F 11/26 714/30 |
| 2016/0043726 | A1 * | 2/2016 | Ku | ............... | G01R 31/30 377/19 |
| 2016/0299806 | A1 * | 10/2016 | Warriner | ............... | G06F 11/0757 |

OTHER PUBLICATIONS

'Out-of-Bounds Pulse-Width Detector' by TradeOflC, copyright 2008-2011.*
'Online Measurement of Timing in Circuits: for Health Monitoring and Dynamic Voltage & Frequency Scaling' by Joshua M. Levine et al., 2012 IEEE 20th International Symposium on Field-Programmable Custom Computing Machines.*
'PSoC 4 Timer Counter Pulse Width Modulator (TCPWM)—PSoC Creator Component Datasheet' by Cypress Semiconductor Corporation, Mar. 28, 2016.*

* cited by examiner

SYSTEM INTERNAL LATENCY MEASUREMENTS IN REALTIME APPLICATIONS

TECHNICAL FIELD

This disclosure relates generally to system internal latency measurements.

BACKGROUND

In an example scenario, debugging a microcontroller system may involve determining the optimum frequency at which to run the microcontroller system. If the frequency is too low, the microcontroller system will not have time to execute internal tasks and system errors may occur (e.g., under-run error). If the frequency is too high, the current consumption increases significantly which may limit the battery life for portable devices.

SUMMARY

Systems, methods, circuits and computer-readable mediums for system internal latency measurements in realtime applications are disclosed. In some implementations, a trigger signal is selected from a plurality of trigger signals for interrupting a processor of an integrated circuit system. The trigger signal includes a pulse having a width. The system detects a rising edge of the pulse and starts a counter. The system detects a falling edge of the pulse and stops the counter. The system then compares a count of the counter with first and second values stored in first and second registers, respectively. The first value represents a captured minimum pulse width and the second value represents a captured maximum pulse width. The count is stored in the first or second register based on a result of the comparing.

Other implementations are directed to systems, methods, circuits and computer-readable mediums.

DETAILED DESCRIPTION

Systems, methods, circuits and computer-readable mediums are disclosed for system internal latency measurements in realtime applications.

Figure 1:
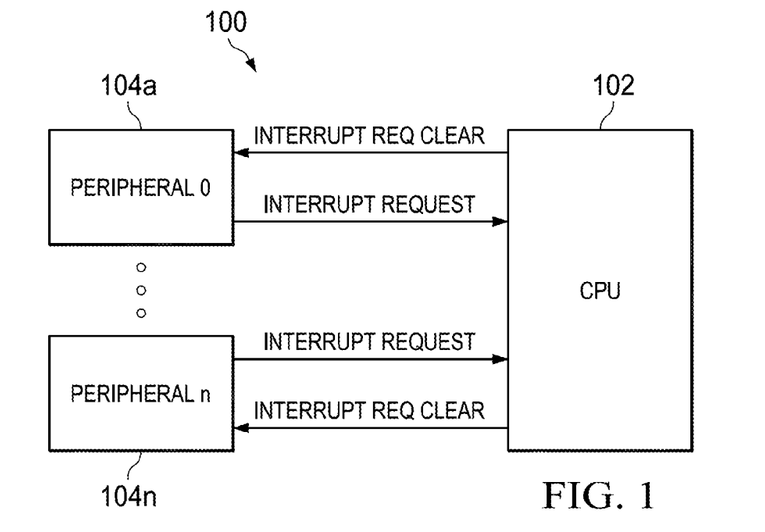
FIG. 1 is a block diagram illustrating communication system between a central processing unit (CPU) and peripherals.

FIG. 1 is a block diagram illustrating communication system 100 between a central processing unit (CPU) and peripherals. System 100 includes CPU 102 and peripherals 104a . . . 104n. When peripheral 104 has completed an action, which requires CPU 102 activity, an interrupt request signal is generated by one or more of peripherals 104a . . . 104n and sent to CPU 102. When CPU 102 has completed this interrupt initiation, CPU 102 will send an interrupt request clear signal to the requesting peripheral allowing the peripheral to release its interrupt request signal.

Figure 2:
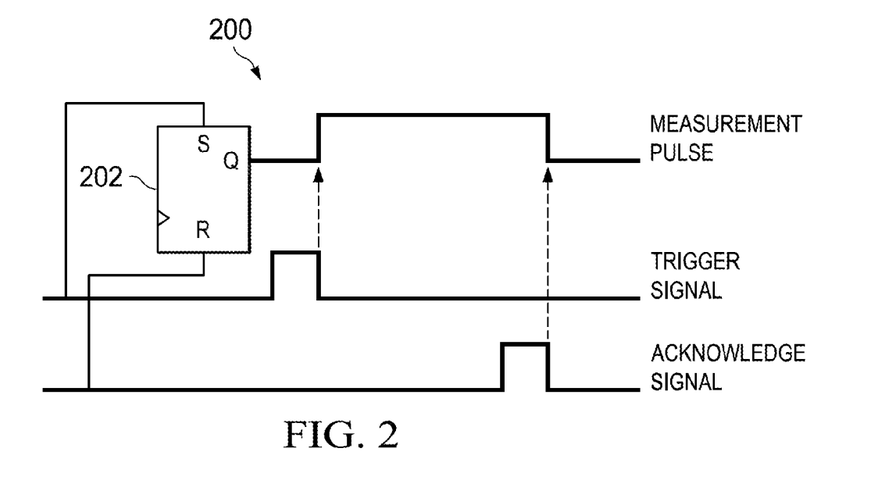
FIG. 2 is a block diagram illustrating an interrupt generation circuit.

FIG. 2 is a block diagram illustrating an interrupt generation circuit 200. Circuit 200 includes latch 202 (e.g., an SR flip-flop) having a set input (S) coupled to a trigger signal and a reset input (R) coupled to an acknowledge signal. Some examples of trigger signals include but are not limited to: an interrupt request signal (IRQ), a direct memory access (DMA) transfer request signal, an event system event signal, software writing to a trigger bit in a registers and an interrupt acknowledge signal (IRQ flag going off). The interrupt acknowledge signal can be used to measure a pure software contribution to latency, as will be described in further detail below.

Some examples of an acknowledge signal include but are not limited to: an interrupt acknowledge signal (IRQ flag going off), DMA transfer complete signal, an event system event, software that sets an acknowledge bit in a register and an execution of a return from interrupt signal (RETI).

The operation of circuit 200 will now be described for an analog-to-digital converter (ADC) application. When the ADC completes a conversion, CPU 102 is notified to read the conversion result from the ADC. When the conversion is completed, the ADC will send a pulse to latch 202 to set the interrupt request signal high. When CPU 102 receives the interrupt request signal, and depending on the priority of the interrupt signal, CPU 102 can halt the previous interrupt execution and execute the ADC interrupt, or delay the interrupt execution while the previous interrupt request signal is not completed.

If in the system there is only the ADC interrupt enabled, the interrupt request pulse width represents the minimum time CPU 102 takes to initiate the execution of the interrupt routine, including the different bus latencies. If more interrupts are enabled, the interrupt request pulse width represents the time CPU 102 takes to start execution of the interrupt routine, including the different bus latencies and latencies related to previous interrupt execution. This time may vary depending on the interrupt number enabled in the system and the interrupt priority order. As described in reference to FIG. 3, a maximum and minimum hardware execution time can be automatically measured for an application without any intrusion.

Figure 3:
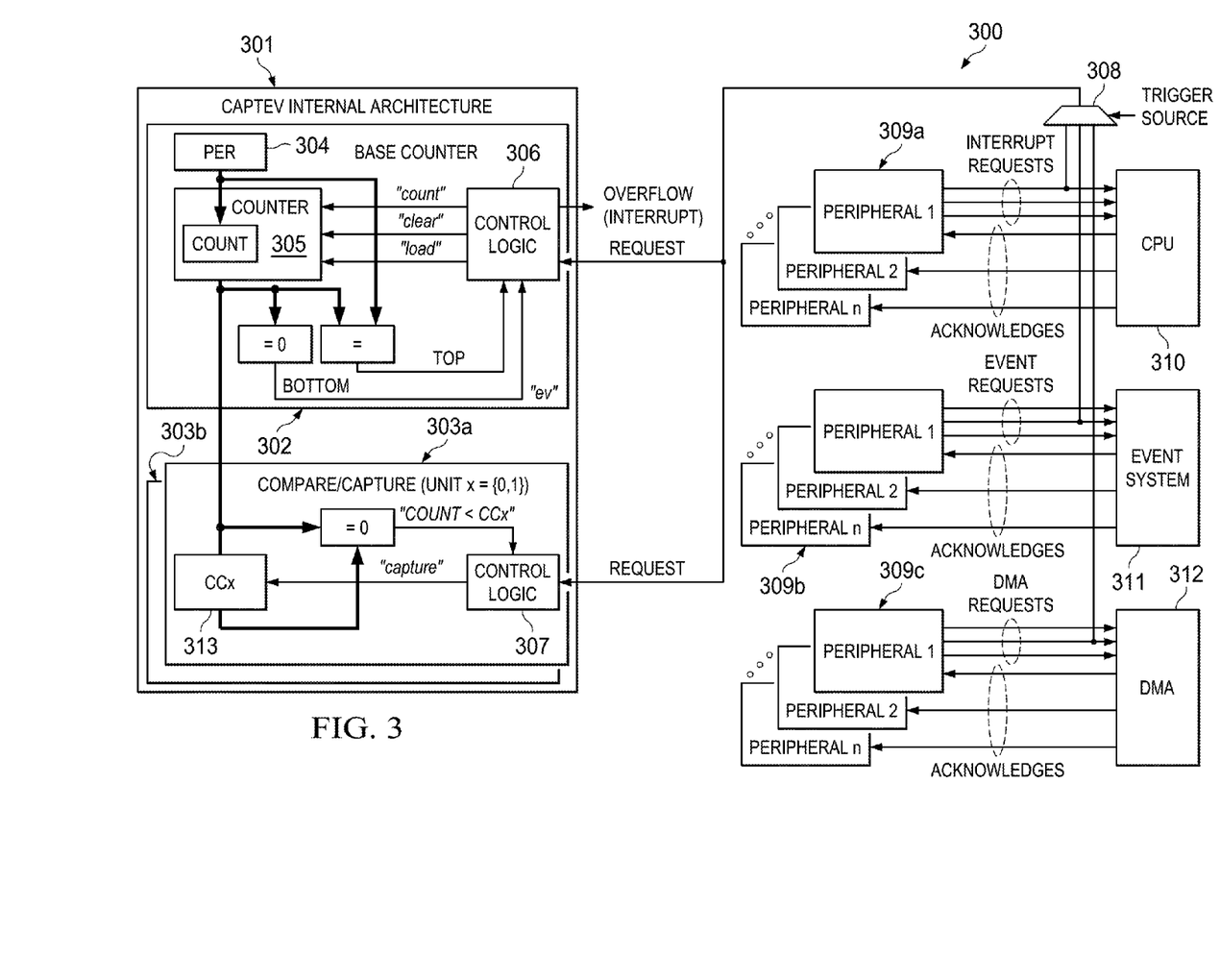
FIG. 3 is a block diagram of a system for performing system internal latency measurements in realtime applications.

FIG. 3 is a block diagram of a system 300 for performing system internal latency measurements in realtime applications. System 300 is configured to measure minimum and maximum widths of a trigger signal pulse, as described in reference to FIG. 2. System 300 can be included in an integrated circuit system, such as a microcontroller system. In some implementations, system 300 includes circuit module 301 coupled to selecting device 308. Circuit module 301 includes base counter 302 and a set of compare/capture units 303a and 303b. Base counter 302 includes PER register 304, counter 305 and control logic 306. Each compare/capture unit 303a or 303b includes compare and capture registers 313 (CC0, CC1) and control logic 307.

In operation, base counter 302 receives a selected trigger signal from selector 308. In the example shown, the trigger signal is an interrupt request signal and selecting device 308 is a multiplexer that selects one of a plurality of interrupt request signals based on a trigger source. In some implementations, the trigger source is a set of bits (e.g., user-configured bits). One of a plurality of interrupt request signals is selected by the trigger source to be output from selecting device 308. The example configuration shown in FIG. 3 measures one interrupt request signal pulse width at a time. Multiple instances of circuit module 301 can be implemented in system 300 to measure multiple trigger signal pulse widths at the same time.

PER register 304 stores a maximum value for counter 305. In response to a "count" signal provided by control logic 306, counter 305 counts up from zero to the maximum value in PER register 304 or counts down from the value stored in PER register 304 to zero. Control logic 306 also provides a "load" signal for initializing counter 305 and a "clear" signal for clearing counter 305. When the count of counter 305 is equal to zero the bottom signal ("ev") is generated and sent to control logic 306. When the count of counter 305 is equal to PER the top signal ("ev") is generated and sent to control logic 306.

The interrupt request signals are sent by peripherals 309a to CPU 310, sent by peripherals 309b to event system 311 and sent by peripherals 309c to direct memory access (DMA) controller 312. DMA controller 312 transfers data between memories and peripherals 309c with minimal CPU intervention. Event system 311 is a routing network independent of data bus paths that allows peripherals 309b to communicate directly with other peripherals without involving a central processing unit (CPU) or bus resources. Different triggers at the peripheral level can result in an event, which can be indicated by logic values, e.g., 1 or 0.

Compare and capture registers 313 of compare/capture units 303a and/or 303b capture minimum and maximum pulse widths of the selected interrupt request signal. If only one of a minimum or maximum pulse width measurement is needed, then one register 313 of compare/capture unit 303a and/or 303b can be used. In some implementations, a user can program the maximum value for counter 305 into PER register 304 by a user. Control logic 307 can be configured to generate a capture signal in response to a comparison between the count of counter 305 and the values in compare and capture registers 313 of Units 0 and 1 (CC0, CC1).

Figure 4:
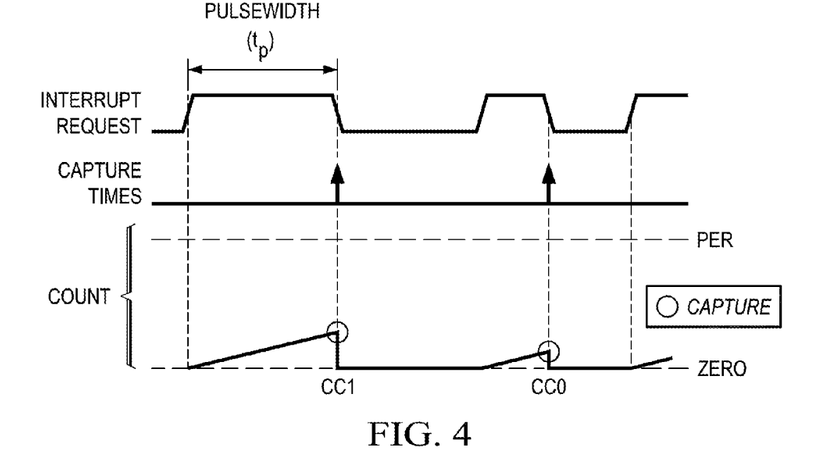
FIG. 4 is a timing diagram illustrating pulse width measurement.

FIG. 4 is a timing diagram illustrating interrupt pulse width measurement. In this example, a received interrupt request input signal is a pulse having width $t_p$. On the rising edge of the pulse, counter 305 starts counting. On the falling edge of the pulse, the count of counter 305 is saved into one of the compare and capture registers 313 (CC0, CC1) depending on the values stored in registers 313 (CC0, CC1). When a capture is completed, counter 305 is cleared and waits for the next rising edge on the interrupt request input signal. The selection of CC1 or CC0 to store the count of counter 305 is described in reference to FIG. 5.

Figure 5:
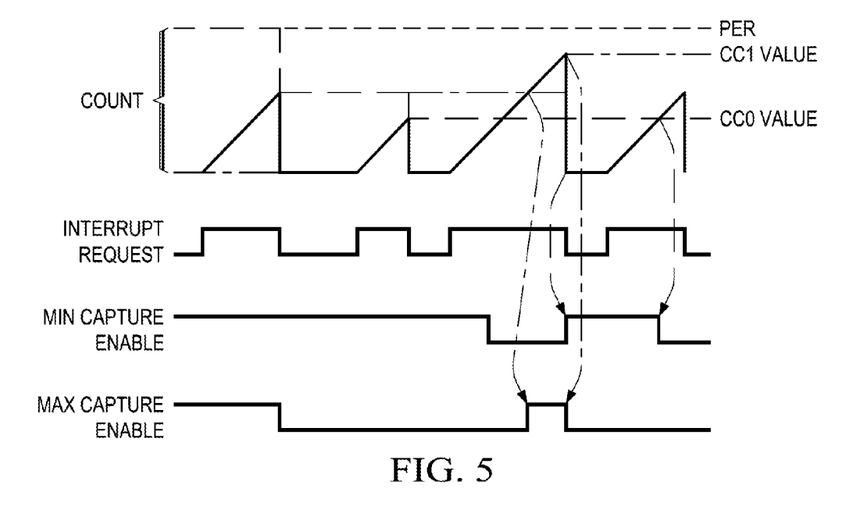
FIG. 5 is a timing diagram illustrating the capture of minimum and maximum pulse widths.

FIG. 5 is a timing diagram illustrating capture of minimum and maximum interrupt pulse widths. In this example, the CC0 register is used to store the minimum pulse width and the CC1 register is used to store the maximum pulse width. After reset, CC0 is initialized with the maximum counter value, which can be taken from PER register 304 (e.g., all bits 1) and CC1 is initialized with the minimum counter value (e.g., all bits 0). On a falling edge of an interrupt request input signal, the values stored in registers CC0, CC1 are compared against the count of counter 305. If CC0 content is greater than the count, then the count is stored in register CC0. If CC1 content is less than the count, then the count is stored in register CC1. In this manner, the value in register CC0 can only decrease and the value in register CC1 can only increase.

Figure 6:
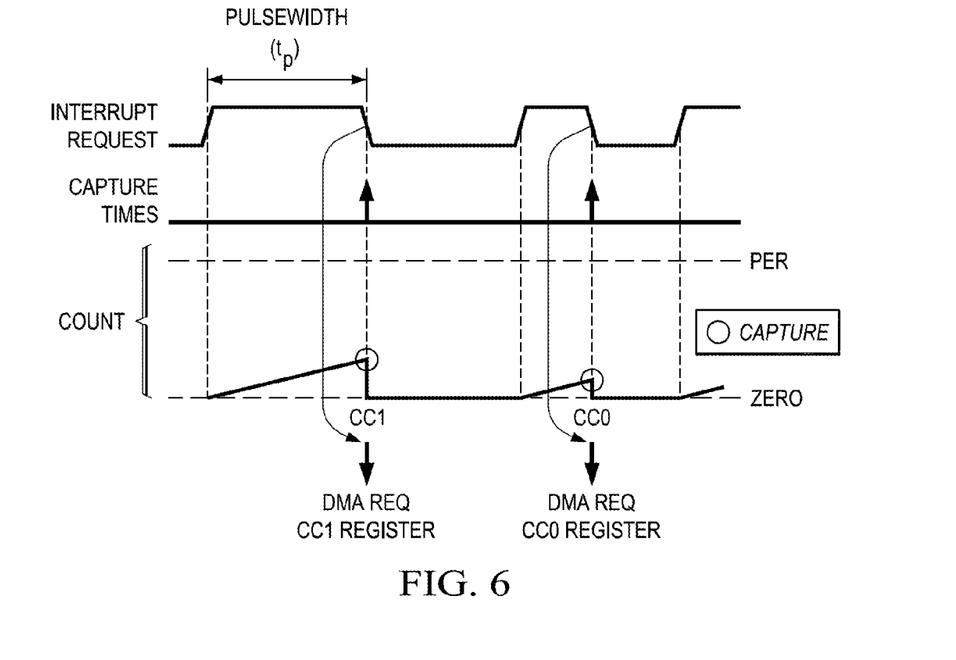
FIG. 6 is timing diagram illustrating DMA transfer of capture registers to memory.

FIG. 6 is timing diagram illustrating DMA transfer of capture registers to memory. In some implementations, a DMA interface (not shown) can be implemented in circuit module 301 to transfer each response time measurement to a buffer (e.g., a ring buffer) using DMA controller 312. In this way a statistical distribution of time consumptions can be identified during testing or during runtime. The user may find that there are only a few instances that excessive time consumption and can use this information to program PER register 304 to trigger an event when a longer than expected time consumption occurs. This event can, in turn, trigger a code break, which will enable the user to see what code was executing that caused the response time to be longer than expected. For example, the unexpected time consumption might be the result of a higher priority interrupt that unintentionally or unexpectedly was triggered. The DMA transfers can take place at capture times as shown in FIG. 6.

In some implementations, during runtime of an application (rather than debugging or testing) the statistical distribution of time consumptions can be transferred to the CPU or clock module to dynamically adjust the system clock frequency during runtime of an application.

Figure 7:
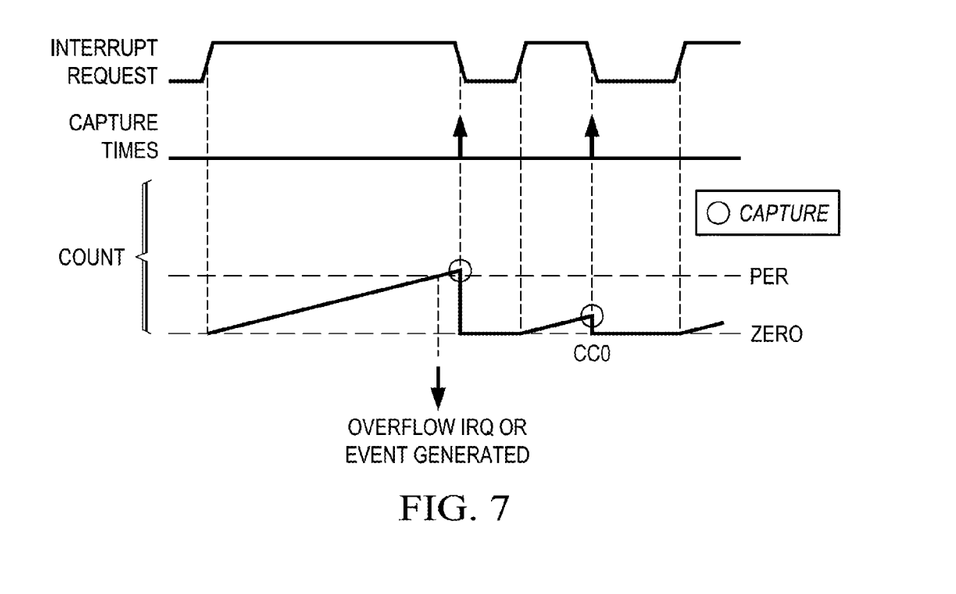
FIG. 7 is a timing diagram illustrating generating overflow/event interrupts.

FIG. 7 is a timing diagram illustrating generating overflow/event interrupts. If during operation counter 305 reaches the maximum counter value this means an acknowledge signal was not sent or generated within an expected maximum time. This can result in an overflow interrupt (IRQ) being generated and/or an event being generated by, for example, event system 311 and sent to CPU 310 to take corrective action. A corrective action may be a system clock or a performance level (e.g., core voltage) increase.

Figure 8:
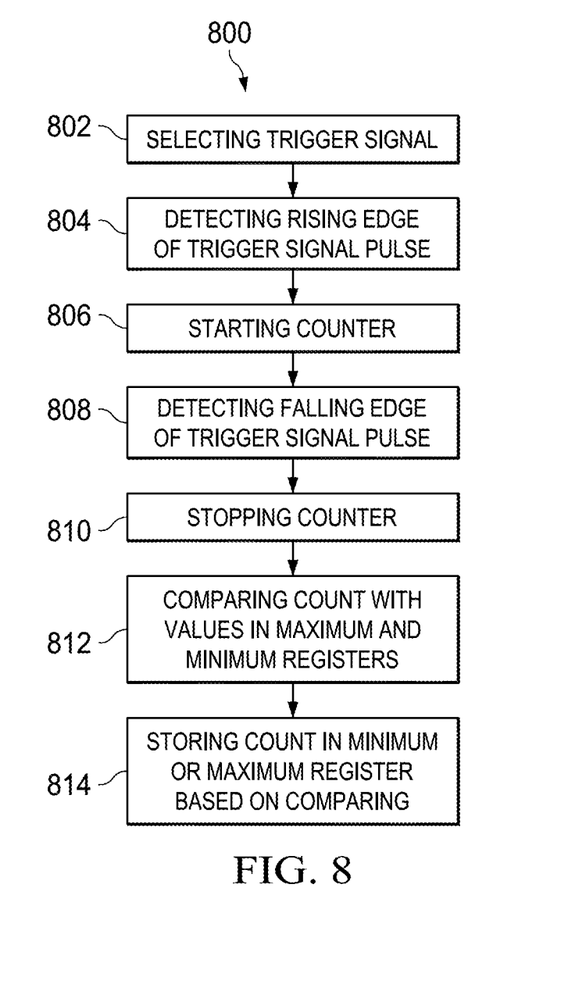
FIG. 8 is a flow diagram of a process of system internal latency measurements for realtime applications.

FIG. 8 is a flow diagram of a process of system internal latency measurements for realtime applications. In some implementations, process 800 can be implemented using system 300, described in reference to FIG. 3. Process 800 can begin by selecting a trigger signal (802). The trigger signal can be, for example, an interrupt request signal generated by a peripheral. The trigger signal can be selected form a plurality of trigger signals by a selecting device, such as multiplexer. The selecting of the trigger signal can be based on user configured bits in a register.

Process 800 can continue by detecting a rising edge of a trigger signal pulse (804) and starting a counter (806), which starts counting up or down until a falling edge of the trigger signal pulse is detected (808), at which time the counter is stopped (810). The counter can be an n-bit up/down counter. A user can program the maximum count of the counter in a register (e.g., PER register 304).

Process 800 can continue by comparing the count of the counter to values stored in maximum and minimum registers (812) and storing the count in one of the maximum or minimum registers based on the comparing. For example, after reset, a first register is initialized with a maximum counter value (e.g., all bits 1) and second register is initialized with a minimum counter value (e.g., all bits 0). On a falling edge of a trigger signal, the values stored in the first and second registers are compared against the count of the counter. If the first register value is greater than count, then the count is stored in the first register. If the value of the second register is less than count, then the count is stored in the second register. In this manner, the first register value can only decrease and the second register value can only increase.

While this document contains many specific implementation details, these should not be construed as limitations on the scope what may be claimed, but rather as descriptions of features that may be specific to particular embodiments.

Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method comprising:
   accessing a trigger signal from a plurality of trigger signals, the trigger signal including a pulse having a width;
   detecting a rising edge of the pulse;
   in response to the detecting of the rising edge, starting a counter;
   detecting a falling edge of the pulse;
   in response to the detecting of the falling edge:
      stopping the counter;
      comparing a count of the counter with first and second values stored in first and second registers, respectively, the first value representing a minimum pulse width and the second value representing a maximum pulse width;
      storing the count in the first or second register based on a result of the comparing; and
      dynamically adjusting a system clock frequency during runtime of an application based on the comparing.

2. The method of claim 1, where the trigger signal is an interrupt request signal from a peripheral of the integrated circuit system for interrupting at least one of a central processing unit (CPU), event system and a direct memory access (DMA) controller of the integrated circuit system.

3. The method of claim 1, further comprising:
   transferring at least one of the first and second values to a buffer; and
   determining a statistical distribution of time consumption based on the first and second values.

4. The method of claim 1, where comparing a count of the counter with first and second values stored in first and second registers, further comprises:
   comparing the first value against the count to determine if the first value is greater than the count, and if the first value is greater than the count, storing the count in the first register as the minimum pulse width.

5. The method of claim 4, where comparing a count of the counter with first and second values stored in first and second registers, further comprises:
   comparing the second value against the count to determine if the second value is less than the count and, if the second value is less than the count, storing the count in the second register as the maximum pulse width.

6. A system for performing system internal latency measurements, comprising:
   a selecting device configured to select a trigger signal from a plurality of trigger signals, the trigger signal including a pulse having a width;
   a counter coupled to the selecting device and configured to: start counting when a rising edge of the pulse is detected and stop counting when a falling edge of the pulse is detected;
   a compare and capture circuit coupled to the counter and configured to: compare a count of the counter with first and second values stored in first and second registers, respectively, the first value representing a minimum pulse width and the second value representing a maximum pulse width; and storing the count in the first or second register based on a result of the comparing; and
   a processing unit or circuit configured to dynamically adjust a system clock frequency during runtime of an application based on the comparing.

7. The system of claim 6, where the trigger signal is an interrupt request signal from a peripheral of the integrated circuit system for interrupting at least one of a central processing unit (CPU), event system and a direct memory access (DMA) controller of the integrated circuit system.

8. The system of claim 6, further comprising:
   an interface coupled to the first and second registers and configured to transfer at least one of the first and second values to a buffer; and
   a central processing unit coupled to the interface and configured to determine a statistical distribution of time consumption based on the first and second values.

9. The system of claim 6, where comparing a count of the counter with first and second values stored in first and second registers, further comprises:
   comparing the first value against the count to determine if the first value is greater than the count, and if the first value is greater than the count, storing the count in the first register as the minimum pulse width; and
   comparing the second value against the count to determine if the second value is less than the count and, if the second value is less than the count, storing the count in the first register as the maximum pulse width.

10. The system of claim 6, where the system is included in a microcontroller system.

11. The system of claim 8, where the interface is a direct memory access (DMA) interface configured to perform a DMA transfer of the values to the buffer.

12. The system of claim 6, where the selecting device is a multiplexer.

13. The system of claim 6, where the first and second registers are initialized with maximum and minimum counter values, respectively.

14. The system of claim 13, further comprising a programmable register configured for storing the maximum counter value.

15. A non-transitory, computer-readable storage medium configured to store instructions, which, when executed by one or more processors, causes the one or more processors to perform operations comprising:
   accessing a trigger signal from a plurality of trigger signals, the trigger signal including a pulse having a width;
   detecting a rising edge of the pulse;
   in response to the detecting of the rising edge, starting a counter;
   detecting a falling edge of the pulse;
   in response to the detecting of the falling edge:
      stopping the counter;
      comparing a count of the counter with first and second values stored in first and second registers, respectively, the first value representing a minimum pulse width and the second value representing a maximum pulse width;
      storing the count in the first or second register based on a result of the comparing; and
      dynamically adjusting a system clock frequency during runtime of an application based on the comparing.

16. The computer-readable medium of claim 15, where the trigger signal is an interrupt request signal from a peripheral of the integrated circuit system for interrupting at least one of a central processing unit (CPU), event system and a direct memory access (DMA) controller of the integrated circuit system.

17. The computer-readable medium of claim 15, further comprising:
  transferring at least one of the first and second values to a buffer; and
  determining a statistical distribution of time consumption based on the first and second values.

18. The computer-readable medium of claim 15, where comparing a count of the counter with first and second values stored in first and second registers, further comprises:
  comparing the first value against the count to determine if the first value is greater than the count, and if the first value is greater than the count, storing the count in the first register as the minimum pulse width.

19. The computer-readable medium of claim 18, where comparing a count of the counter with first and second values stored in first and second registers, further comprises:
  comparing the second value against the count to determine if the second value is less than the count and, if the second value is less than the count, storing the count in the second register as the maximum pulse width.

* * * * *